(12) United States Patent
Chen

(10) Patent No.: US 10,194,555 B2
(45) Date of Patent: Jan. 29, 2019

(54) SERVER SLIDING RAIL QUICK RELEASE MOUNTING STRUCTURE

(71) Applicant: GSLIDE CORPORATION, New Taipei (TW)

(72) Inventor: Yung-Liang Chen, Taipei Shien (TW)

(73) Assignee: GSLIDE CORPORATION, New Taipei (TW)

( * ) Notice: Subject to any disclaimer, the term of this patent is extended or adjusted under 35 U.S.C. 154(b) by 0 days.

(21) Appl. No.: 15/652,451

(22) Filed: Jul. 18, 2017

(65) Prior Publication Data

US 2018/0054911 A1 Feb. 22, 2018

(30) Foreign Application Priority Data

Aug. 16, 2016 (TW) .............................. 105126095 A

(51) Int. Cl.
  *H05K 7/00* (2006.01)
  *H05K 7/14* (2006.01)
  *H05K 7/18* (2006.01)

(52) U.S. Cl.
  CPC ........... *H05K 7/1491* (2013.01); *H05K 7/183* (2013.01)

(58) Field of Classification Search
  CPC ............................ H05K 7/1491; H05K 7/183
  See application file for complete search history.

(56) References Cited

U.S. PATENT DOCUMENTS

| 10,051,759 B1* | 8/2018 | Chen ..................... H05K 7/1489 |
| 2017/0245389 A1* | 8/2017 | Chen ....................... F16L 3/015 |
| 2018/0125234 A1* | 5/2018 | Chen ..................... H05K 7/1489 |

FOREIGN PATENT DOCUMENTS

| TW | I478456 B | 3/2015 |
| TW | I543699 B | 7/2016 |

* cited by examiner

*Primary Examiner* — Anita M King
(74) *Attorney, Agent, or Firm* — Cook Alex Ltd.

(57) ABSTRACT

A server sliding rail quick release mounting structure includes left and right server sliding rail assemblies, a support bar set, a first quick release and a second quick release for detachably connecting the two opposite ends of the support bar set to the left and right server sliding rail assemblies, and an adjustment structure having a connection plate, a retaining element and an adjustment member. A cable management rack may be supported at the left or right server sliding rail assembly, and the adjustment member is rotatable through 180° to fit the mounting direction of the cable management rack.

8 Claims, 16 Drawing Sheets

SERVER SLIDING RAIL QUICK RELEASE MOUNTING STRUCTURE

BACKGROUND OF THE INVENTION

Field of the Invention

The present invention relates to server technology and more particularly, to a server sliding rail quick release mounting structure, which uses a first quick release and a second quick release to connect a support bar set to two server sliding rail assemblies, allowing easy adjustment to fit the direction of a cable management rack at one of the server sliding rail assemblies.

Description of the Related Art

Taiwan Patent Number 1478456 discloses a design of the arrangement of a cable management rack at a right server sliding rail assembly and a support bar set for supporting the cable management rack. However, if the cable management rack is mounted at a left server sliding rail assembly, a different support bar set must be used for supporting the cable management rack.

Further, Taiwan Patent Number 1543699 discloses the use of a quick release for connecting a support bar set to a server sliding rail assembly.

SUMMARY OF THE INVENTION

The present invention overcomes disadvantages of the prior art. It is an object of the present invention to provide a server sliding rail quick release mounting structure, which allows quick connection of two opposite ends of a support bar set to left and right server sliding rail assemblies through a first quick release and a second quick release in a detachable manner, and is conveniently adjustable to fit the extending direction of a cable management rack that is mounted at either one of the left and right server sliding rail assemblies.

It is another object of the present invention to provide a server sliding rail quick release mounting structure, which allows the first and second quick releases at the two opposite ends of the support bar set to be conveniently and rapidly mounted to or dismounted from the connecting frame at the intermediate sliding rail of one server sliding rail assembly and the outer sliding rail of the other server sliding rail assembly without tools.

In a first aspect, the disclosure provides

DETAILED DESCRIPTION OF THE INVENTION

Figure 6:
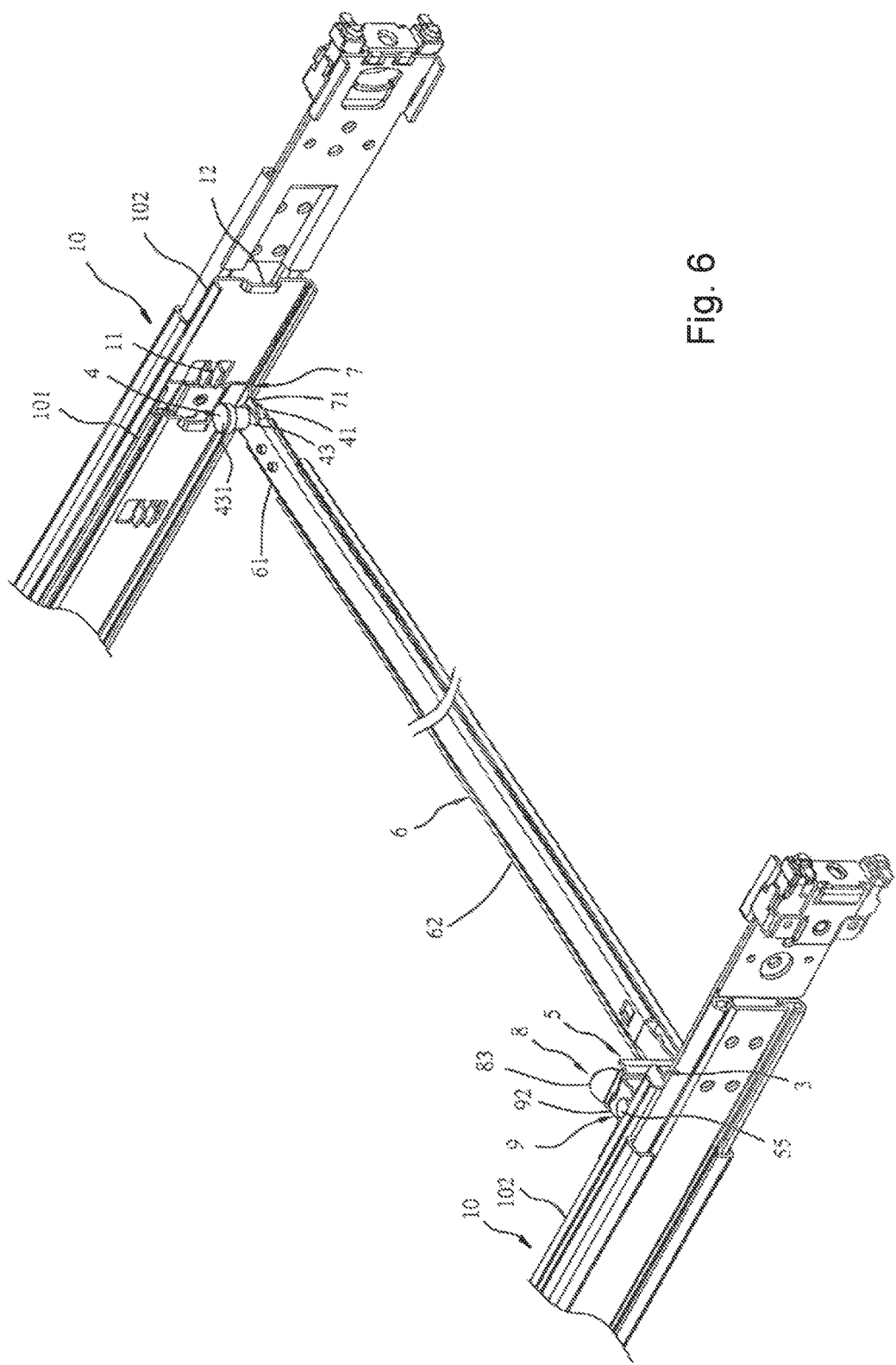
FIG. 6 is a perspective view of the present invention, illustrating the server sliding rail quick release mounting structure connected between two server sliding rail assemblies.
Figure 7:
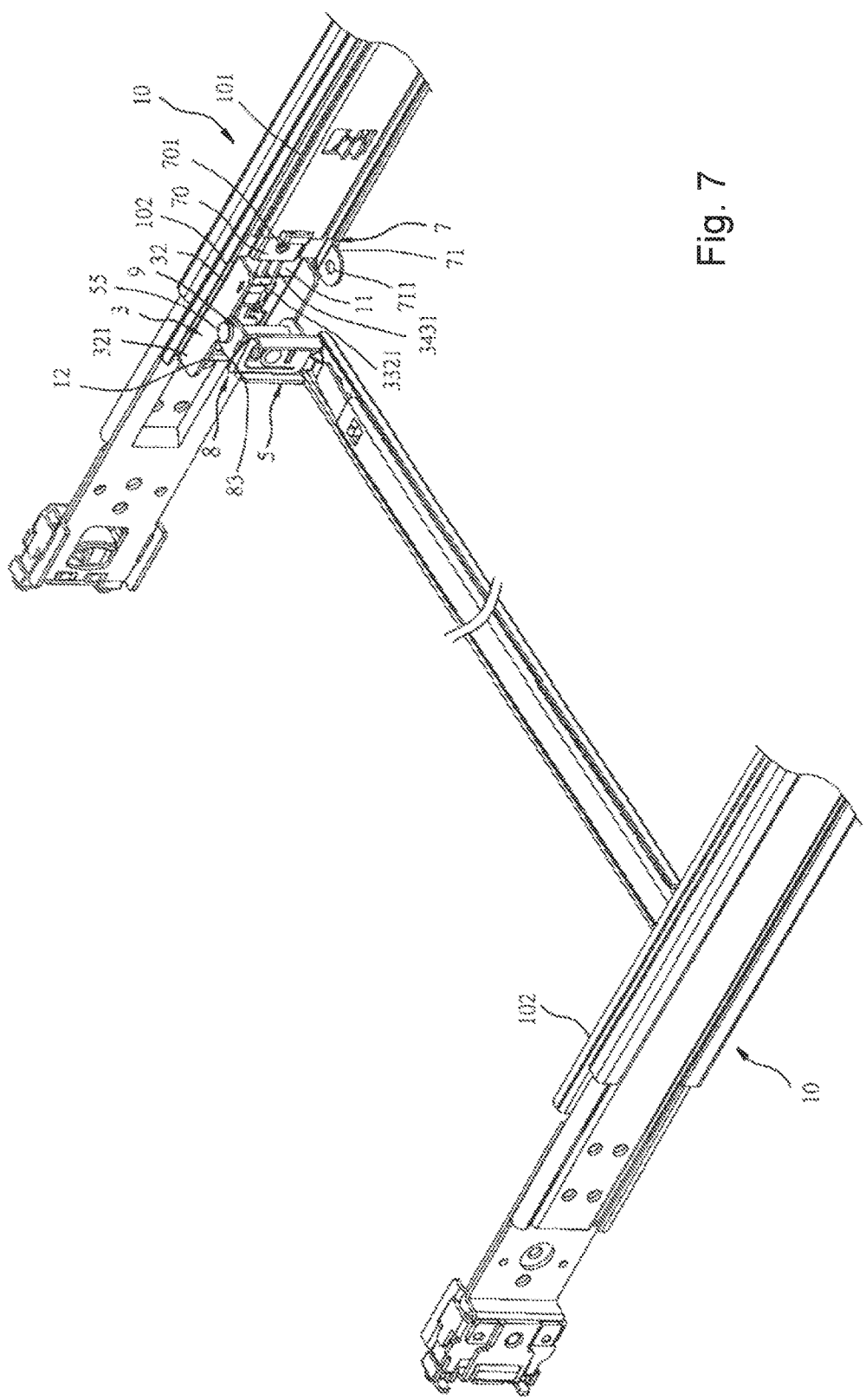
FIG. 7 is a perspective view that corresponds to FIG. 6 when viewed from another angle.
Figure 8:
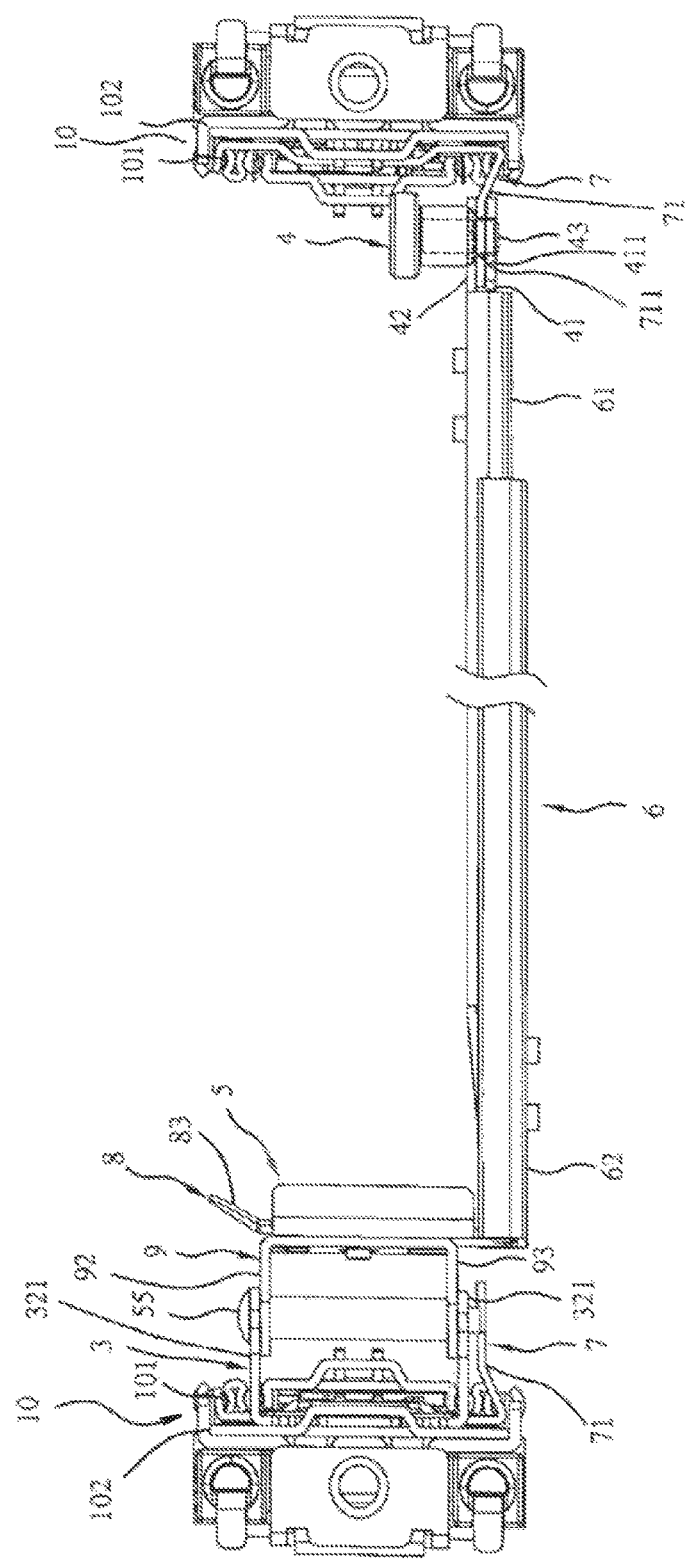
FIG. 8 is a schematic front plan view of the assembly shown in FIG. 7.
Figure 9:
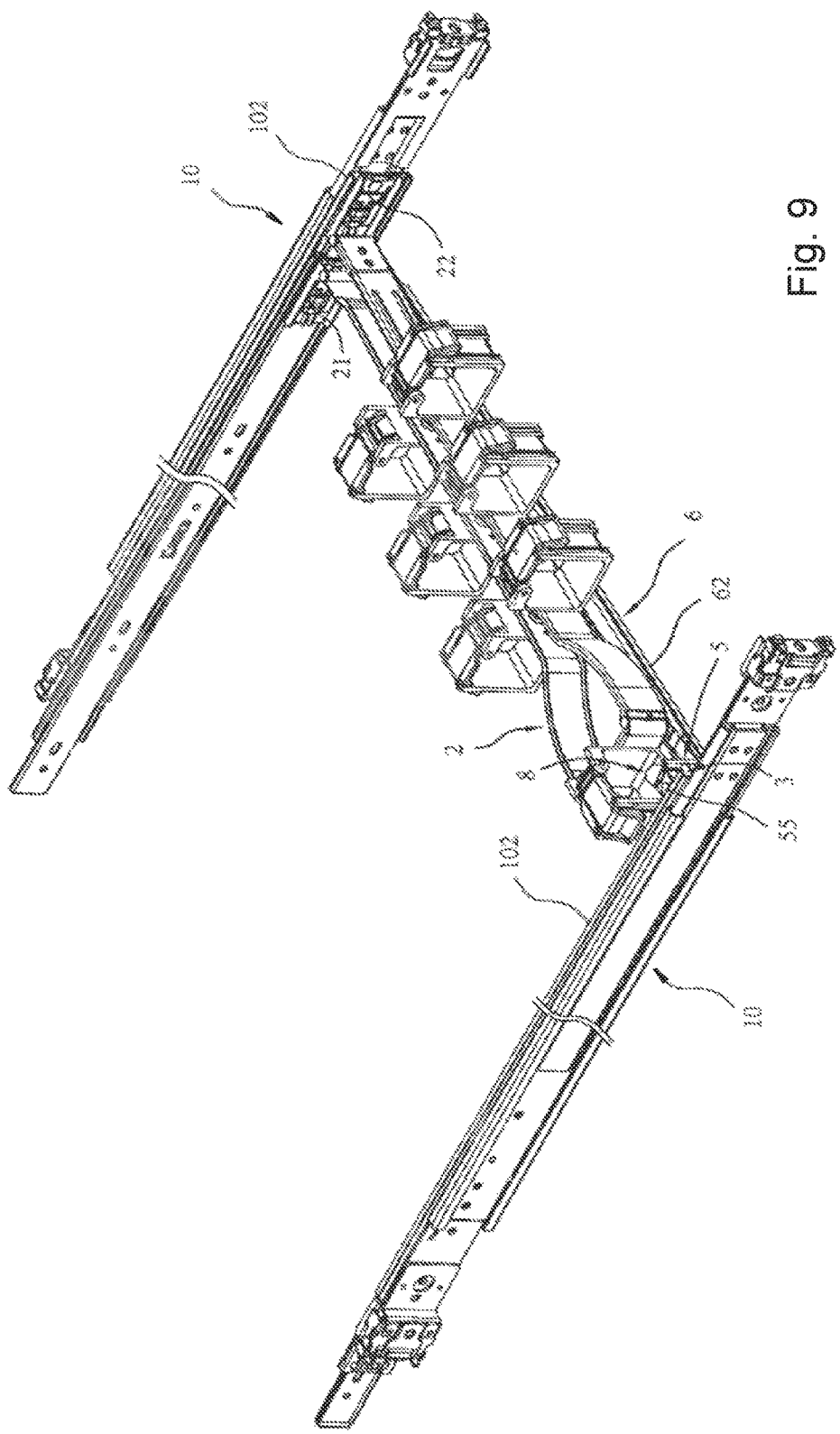
FIG. 9 corresponds to FIG. 6, illustrating a cable management rack mounted on the support bar set.
Figure 10:
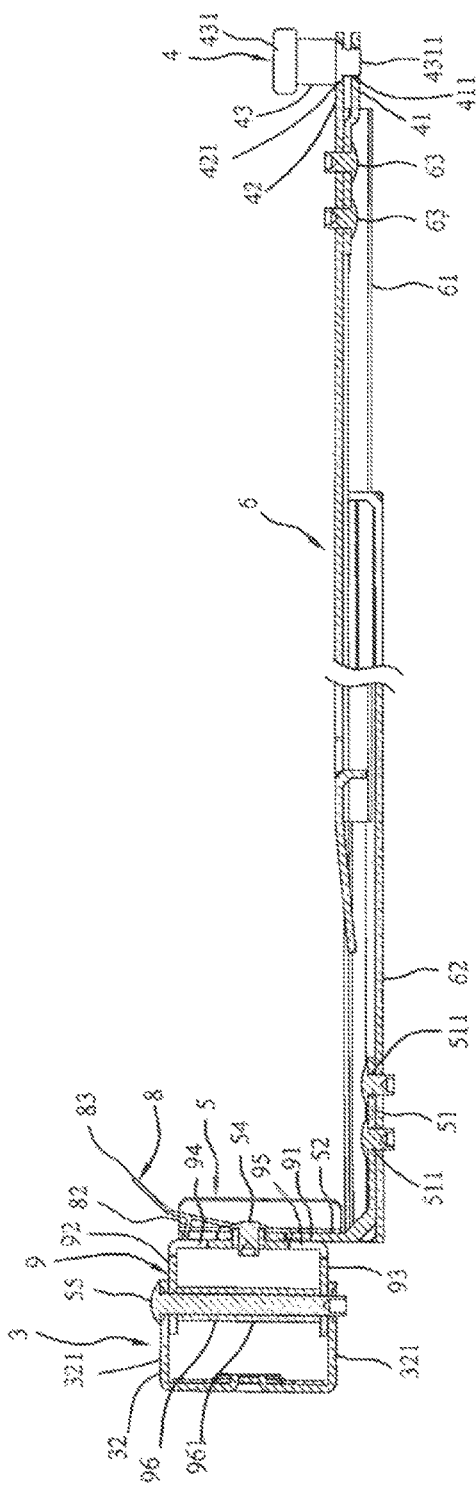
FIG. 10 is a schematic cross-sectional view of the present invention, illustrating the engagement portion of the retaining element moved away from the first retaining slot of the adjustment member.

Referring to FIGS. 1-21, a server sliding rail quick release mounting structure in accordance with the present invention is shown. The server sliding rail quick release mounting structure, as shown in FIGS. 6-8, comprises two server sliding rail assemblies 10 each consisting of an inner sliding rail (seen in FIG. 8), an intermediate sliding rail 101 and an outer sliding rail 102, a connecting frame 7 (see FIG. 7) affixed to the intermediate sliding rail 101 of each server sliding rail assembly 10, at least one engagement plate 11 (see FIGS. 6 and 7) and a horizontal insertion groove 12 (see FIGS. 6 and 7) arranged on the outer sliding rail 102 of each server sliding rail assembly 10, a support bar set 6, a second quick release 4 (see FIGS. 6-8) detachably connecting one end of the support bar set 6 to the connecting frame 7 at the intermediate sliding rail 101 of one server sliding rail assembly 10, and a first quick release 3 detachably connecting an opposite end of the support bar set 6 to the engagement plate 11 and the horizontal insertion groove 12 at the outer sliding rail 102 of the other server sliding rail assembly 10. The connecting frame 7 comprises a connecting plate 70 (see FIG. 7) fixedly fastened with one end thereof to one end of the associating intermediate sliding rail 101 by a first fastening member, for example, rivet 701, an angled lug 71 extended from the connecting plate 70, and a pivot hole 711 cut through the angled lug 71 (see FIG. 7).

The first quick release 3 (see FIGS. 1, 3, 4, and 16-19) comprises a quick release holder bracket 32, a control spring plate 33 and an actuation member 34.

The quick release holder bracket 32 comprises opposing top and bottom pivot holder panels 321, a pivot hole 3211 located on each pivot holder panel 321, a slot 323 (see FIGS. 16-18) cut through opposing front and back sides thereof and defining a narrow slot portion 3231 (see FIGS. 15 and 16), two stop flanges 324 respectively located at two opposite sides of the narrow slot portion 3231 (see FIG. 16), a plug piece 325 protruded from one end thereof, and a retaining hole 326 disposed near an opposite end thereof.

The control spring plate 33 is fixedly connected to a middle part of one end of the quick release holder bracket 32 by a fastener 322, comprising an inverted U-shaped slot 330 (see FIG. 17), an inner spring plate part 331 surrounded by the inverted U-shaped slot 330 and an outer spring plate part 332 surrounding the inverted U-shaped slot 330. The inner spring plate part 331 is fixedly connected with one end thereof to the quick release holder bracket 32 by a fastener 322 that engages an inner hole 3311 (see FIG. 17) that faces toward the slot 323 of the quick release holder bracket 32 (see FIGS. 15 and 16), and includes two curved protruding portions 3312 at two opposite sides of the inner hole 3311. The curved protruding portions 3312 are pivotally connected to the quick release holder bracket 32 by the actuation member 34. The outer spring plate part 332 comprises a baffle portion 3321 located at a free end thereof and adapted for stopping against a part of the retaining hole 326 of the quick release holder bracket 32. The baffle portion 3321 can be biased by the actuation member 34 to move away from the retaining hole 326 (see FIG. 19). After release of the pressure on the actuation member 34, the elastic restoring energy of the outer spring plate part 332 immediately returns the baffle portion 3321 into abutment against the retaining hole 326 of the quick release holder bracket 32 (see FIG. 18).

The actuation member 34 comprises two pivot rods 341 (see FIG. 17) pivotally coupled between the two curved protruding portions 3312 of the control spring plate 33 and the quick release holder bracket 32, a grip 342 located at one end thereof and facing toward the inner hole 3311 of the control spring plate 33 (see FIG. 17) and the slot 323 of the quick release holder bracket 32, and an actuation portion 343 located at an opposite end thereof. An actuation portion 343 has an end edge 3431 for stopping against the engagement plate 11 at the outer sliding rail 102 of the server sliding rail assembly 10 (see FIGS. 6, 7 and 17). The actuation portion 343 is inserted in between the baffle portion 3321 of the outer spring plate part 332 of the control spring plate 33 and the slot 323 of the quick release holder bracket 32, so that when the grip 342 of the actuation member 34 is pressed by an external force (see FIG. 19), the actuation portion 343 of the actuation member 34 can be forced to move the baffle portion 3321 of the outer spring plate part 332 of the control spring plate 33 (see FIG. 19).

Further, the grip 342 of the actuation member 34 defines a neck portion 3422 disposed between the two stop flanges 324 of the quick release holder bracket 32 (see FIG. 16) to prevent deviation when the grip 342 of the actuation member 34 is pressed by an external force.

Thus, when connecting the opposite end of the support bar set 6 to the outer sliding rail 102 of the server sliding rail assembly 10 through the first quick release 3, a user attaches the retaining hole 326 of the quick release holder bracket 32 of the first quick release 3 onto the engagement plate 11 of the outer sliding rail 102, causing the engagement plate 11 to move away the actuation portion 343 of the actuation member 34 and the baffle portion 3321 of the control spring plate 33. Thereafter, the user inserts the plug piece 325 of the quick release holder bracket 32 into the horizontal insertion groove 12 at the outer sliding rail 102 (see FIG. 7), enabling the end edge 3431 of the actuation portion 343 of the actuation member 34 to be secured in place by the engagement plate 11 at the outer sliding rail 102. When detaching the first quick release 3, the user presses the grip 342 of the actuation member 34 (see FIG. 19) to bias or tilt the actuation member 34, forcing the actuation portion 343 to move the baffle portion 3321 of the outer spring plate part 332 of the control spring plate 33 (see FIG. 19) away from the engagement plate 11 of the outer sliding rail 102, and thus, the plug piece 325 of the quick release holder bracket 32 is separated from the horizontal insertion groove 12 at the outer sliding rail 102. Therefore, this first quick release dismounting operation can be performed rapidly and conveniently without tools. When the user releases the applied force from the grip 342, the elastic restoring energy of the baffle portion 3321 of the control spring plate 33 immediately moves the actuation portion 343 of the actuation member 34 back to its previous position (see FIG. 18).

Figure 3:
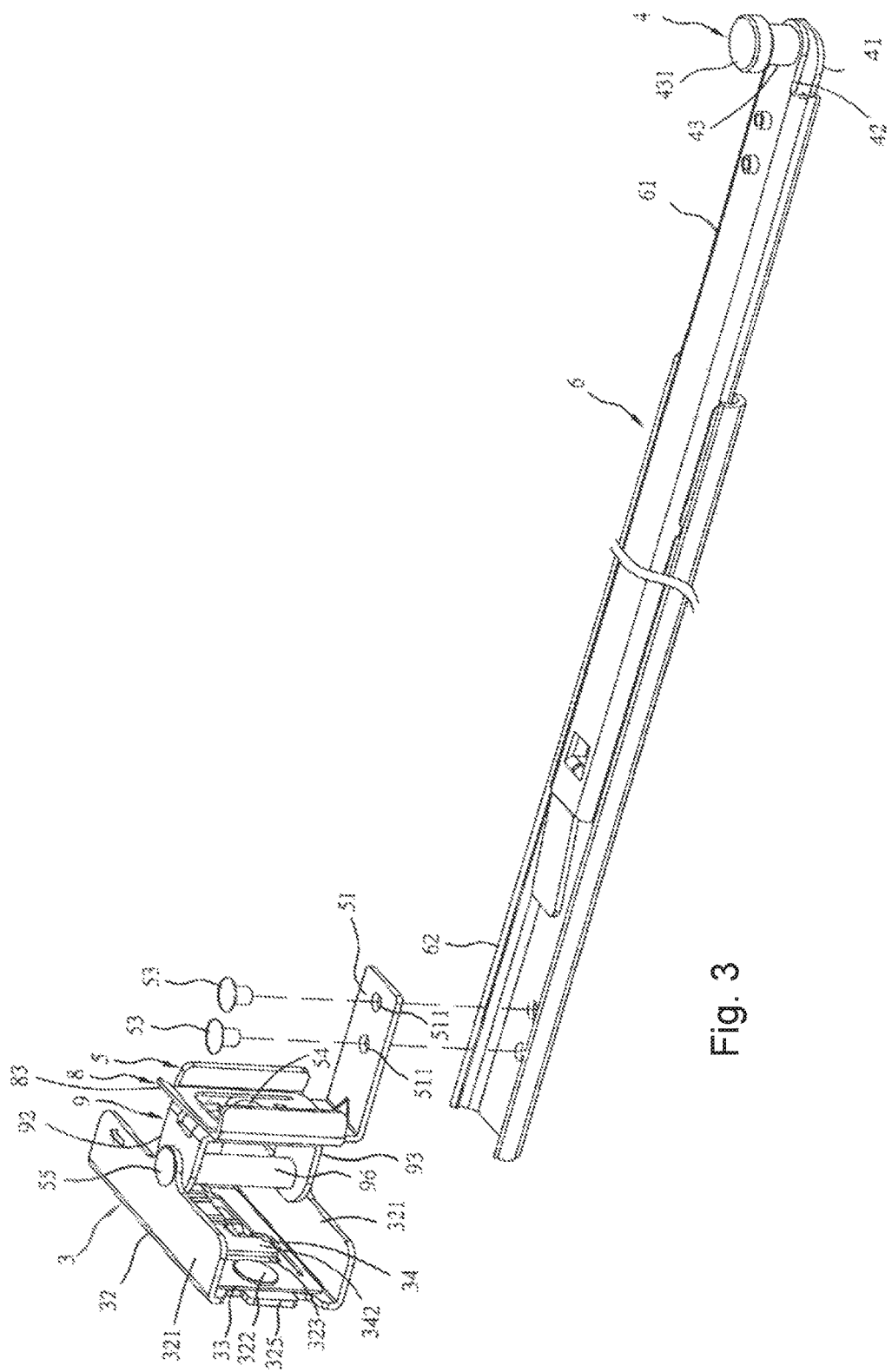
FIG. 3 is an exploded perspective view of the present invention, illustrating the relationship between the second quick release and the support bar set.
Figure 4:
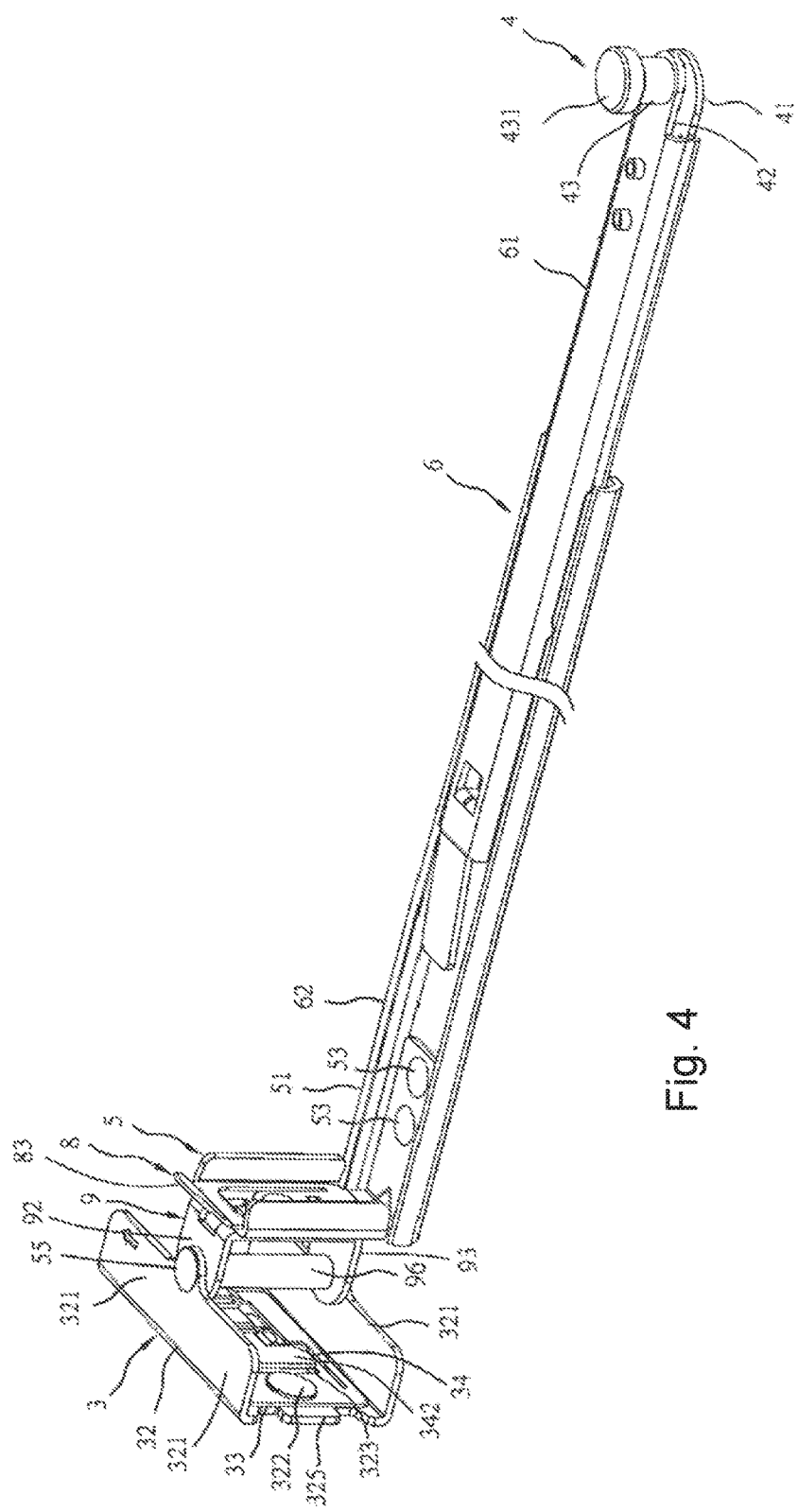
FIG. 4 is a perspective assembly view of the components shown in FIG. 3.
Figure 20:
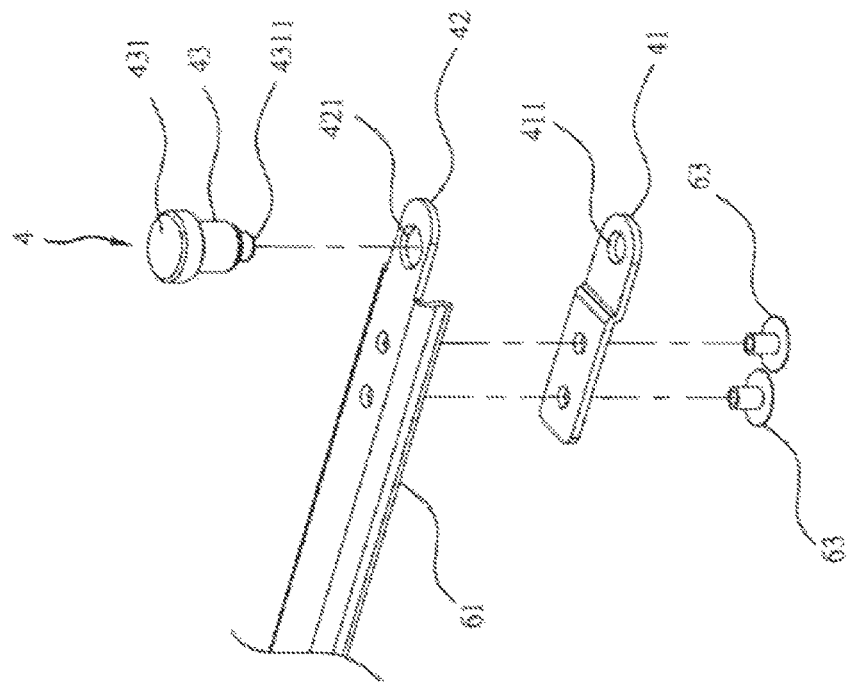
FIG. 20 is an exploded perspective view, in an enlarged scale of a part of the present invention, illustrating the relationship between the second quick release and the support bar set.
Figure 17:
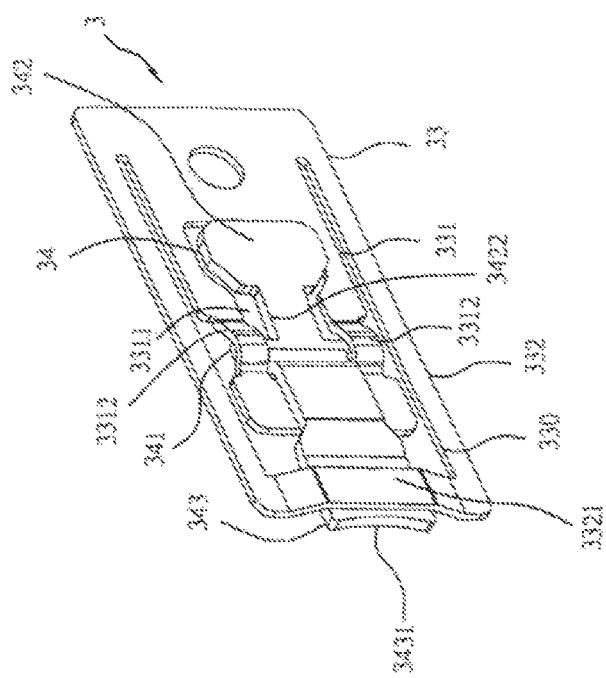
FIG. 17 is a perspective assembly view, in an enlarged scale, of a portion of the first quick release.
Figure 18:
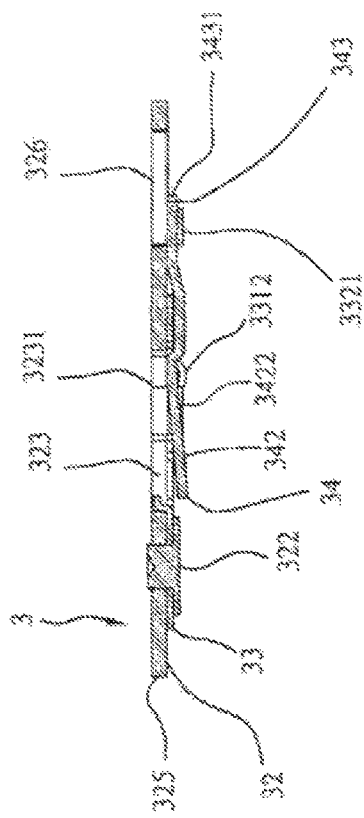
FIG. 18 is a schematic cross-sectional view, in an enlarged scale, of the first quick release.
Figure 19:
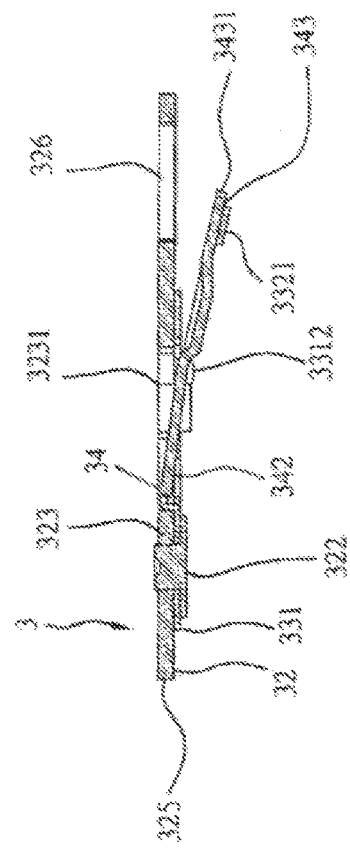
FIG. 19 is a schematic cross-sectional view similar to FIG. 18, illustrating the actuation member of the first quick release when biased by a user.
Figure 21:
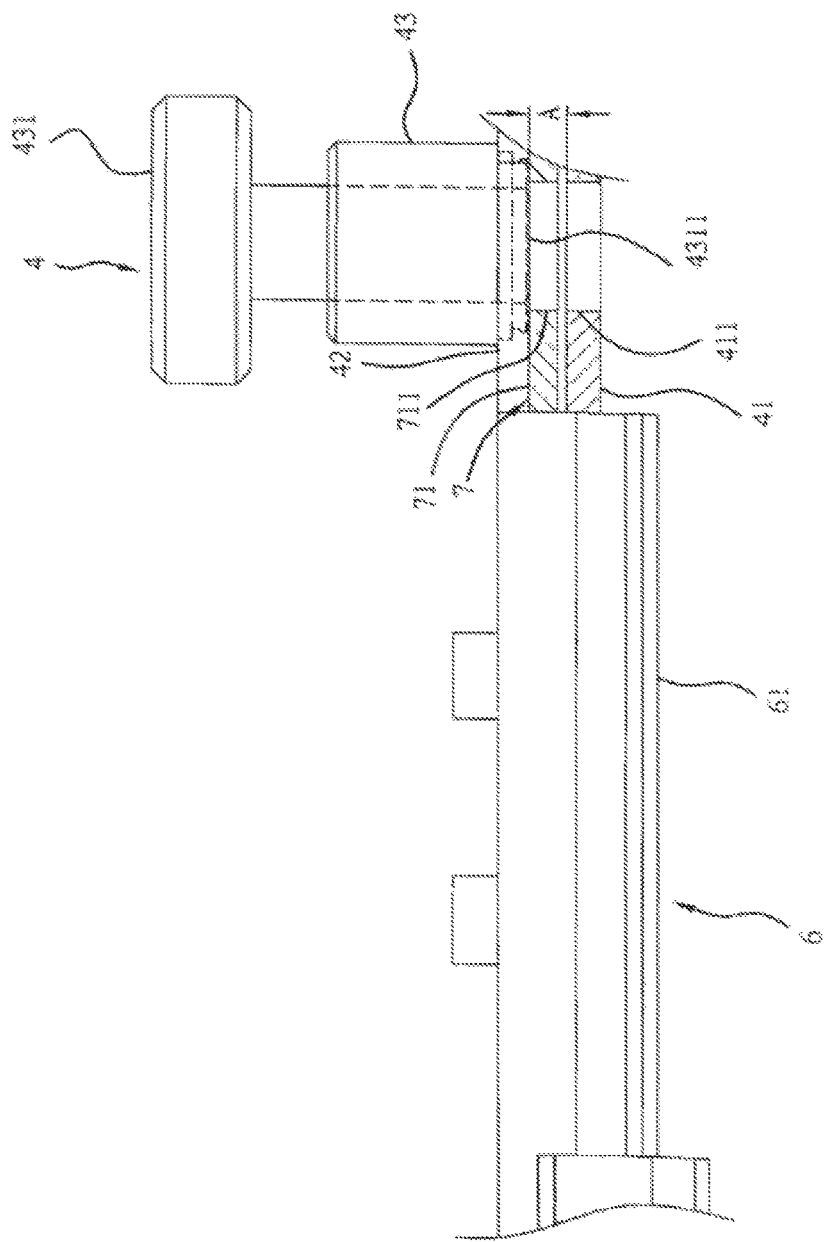
FIG. 21 is a schematic cross-sectional view, in an enlarged scale, of a part of the present invention, illustrating the spring bolt of the second quick release disengaged from the pivot hole of the connecting frame of the intermediate sliding rail of the respective server sliding rail assembly.

Further, as illustrated in FIGS. 3, 20 and 21, the support bar set 6 comprises a first bar member 61 and a second bar member 62 coupled to and movable along the first bar member 61 to adjust the length of the support bar set 6. The first bar member 61 has one end thereof connected to the second quick release 4, and an opposite end thereof pivotally connected to the first quick release 3.

The second quick release 4 comprises a positioning plate 41, a locating plate 42 and a spring bolt 43.

The positioning plate 41 (see FIG. 20) can be an integrated part extended from one end of the first bar member 61. Alternatively, the positioning plate 41 can be a separate member fixedly fastened to one end of the first bar member 61. The positioning plate 41 comprises a positioning hole 411 (see FIG. 20).

The locating plate 42 can be a separate member fixedly fastened to the first bar member 61 by one or more second fastening members 63. Alternatively, the locating plate 42 can be an integrated part extended from one end of the first bar member 61. Further, the locating plate 42 is spaced from the positioning plate 41 by a gap A (see FIG. 21). Further, the locating plate 42 comprises a through hole 421 for the mounting of the spring bolt 43.

The spring bolt 43 comprises a head 431 and a reduced diameter tip 4311. In installation, the reduced diameter tip 4311 is inserted through the through hole 421 of the locating plate 42 (see FIG. 20) into the positioning hole 411 of the positioning plate 41. Pulling the head 431 of the spring bolt 43 upward (see FIG. 21) can move the reduced diameter tip 4311 backward out of the positioning hole 411 of the positioning plate 41 (see FIG. 21) to the through hole 421 of the locating plate 42 (see FIG. 20) for allowing the angled lug 71 of the connecting frame 7 at the intermediate sliding rail 101 to be inserted into the gap A between the positioning plate 41 and the locating plate 42 (see FIG. 21). When the user releases the pulling force from the head 431 of the spring bolt 43, the elastic restoring energy of the spring bolt 43 immediately forces the reduced diameter tip 4311 into the pivot hole 3211 of the angled lug 321 and the positioning hole 411 of the positioning plate 41 (see FIG. 8).

Thus, when using the second quick release 4 to connect the opposite end of the support bar set 6 to the intermediate sliding rail 101 of the other server sliding rail assembly 10, the user pulls up the head 431 of the spring bolt 43 of the second quick release 4 (see FIG. 21) to disengage the reduced diameter tip 4311 from the positioning hole 411 of the positioning plate 41(see FIG. 21) and to move the reduced diameter tip 4311 backward to the inside of the through hole 421 of the locating plate 42 for allowing insertion of the angled lug 71 of the connecting frame 7 at the intermediate sliding rail 101 into the gap A between the positioning plate 41 and the locating plate 42. Thereafter, releases the upward pulling force from the spring bolt 43, enabling the reduced diameter tip 4311 to be forced by the elastic restoring energy of the spring bolt 43 into the pivot hole 711 of the angled lug 71 and the positioning hole 411 of the positioning plate 41 (see FIG. 8) to lock the second quick release 4 to the intermediate sliding rail 101 of the other server sliding rail assembly 10. In contrast, when wishing to disconnect the second quick release 4 of the support bar set 6 from the intermediate sliding rail 101 of the other server sliding rail assembly 10, the user pulls the head 431 of the spring bolt 43 upward to disengage the reduced diameter tip 4311 from the pivot hole 711 of the angled lug 71 at the connecting frame 7 (see FIG. 21). Thus, it is quick and convenient to mount and dismount the support bar set 6, without need for tools.

The server sliding rail quick release mounting structure (see FIGS. 1-5) further comprises a connection plate 5, a retaining element 8 and an adjustment member 9.

The connection plate 5 comprises a first connection plate wall 51 and a second connection plate wall 52 connected at a right angle. The first connection plate wall 51 has at least one, for example, two through holes 511 by which it is fixedly connected to one end of the second bar member 12 by respective third fastening members, for example, rivets 53 (see FIG. 3). The second connection plate wall 52 has a top end thereof pivotally connected to the retaining element 8 and the adjustment member 9 by a first pivot member 54.

The retaining element 8 comprises a through hole 81 located on a middle part thereof and which is pivotally connected to the second connection plate wall 52 of the connection plate 5, a protruded engagement portion 82 is spaced above the through hole 81, and adapted for engaging the adjustment member 9, and a finger strip 83 located at a top side thereof for gripping by the fingers of the user.

Figure 2:
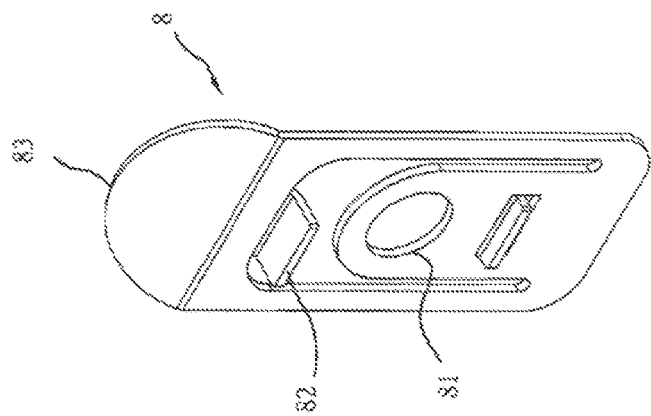
FIG. 2 is a perspective view of the retaining element shown in FIG. 1.
Figure 1:
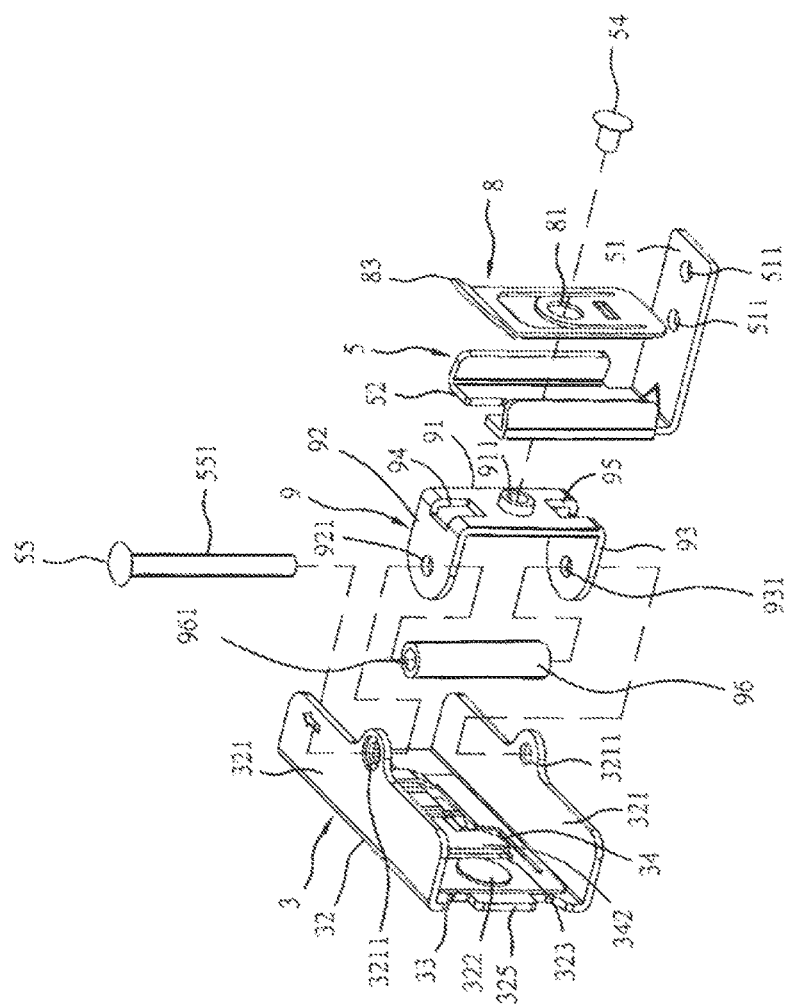
FIG. 1 is an exploded perspective view of a part of a server sliding rail quick release mounting structure in accordance with the present invention, illustrating the relative relationship among a second quick release, a connection plate, a retaining element and an adjustment member.
Figure 5:
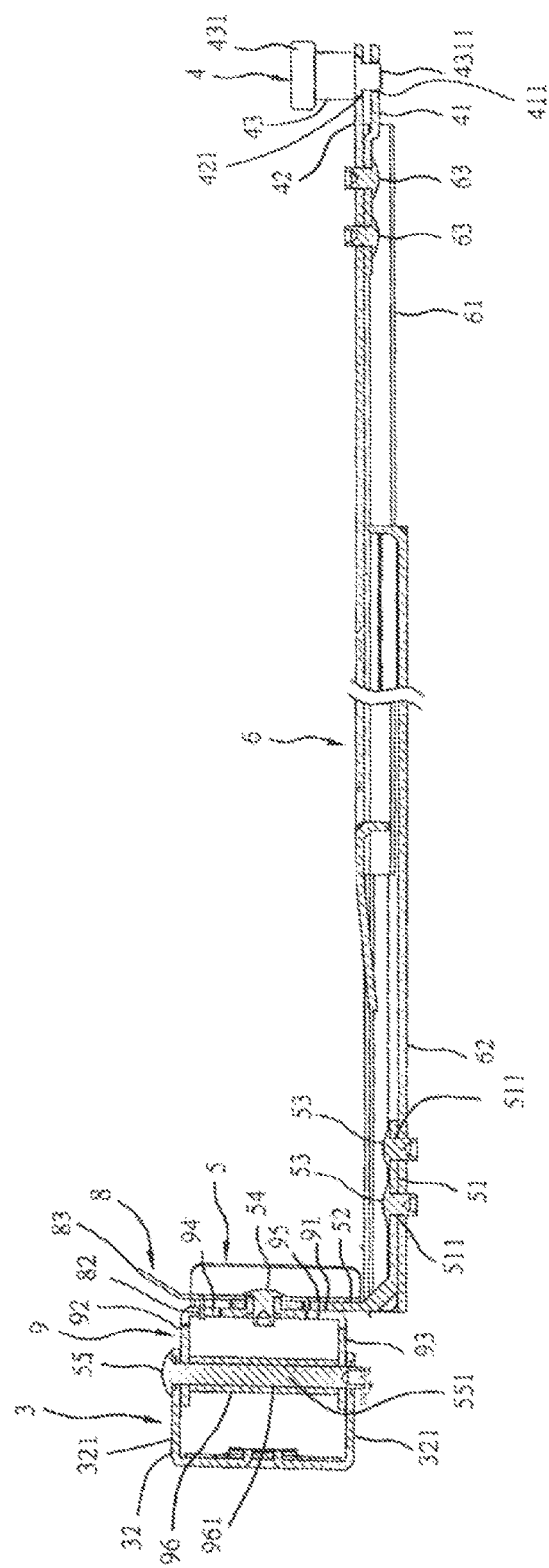
FIG. 5 is a cross-sectional side view of the assembly shown in FIG. 4.

The adjustment member 9 comprises a base panel 91, opposing top and bottom panels 92, 93 respectively and perpendicularly extended from opposing top and bottom sides of the base panel 91, a pivot hole 911 located on a middle part of the base panel 91 and pivotally connected to the connection plate 5 and the retaining element 8, a top retaining slot 94 located at the junction between the base panel 91 and the top panel 92, and a bottom retaining slot 95 located at the junction between the base panel 91 and the bottom panel 93 (see FIGS. 1 and 5). When the adjustment member 9 is rotated through 180°, the engagement portion 82 of the retaining element 8 can be selectively engaged into the top retaining slot 94 or bottom retaining slot 95. Further, pivot holes 921, 931 are respectively located on the top and bottom panels 92, 93 and respectively pivotally connected to the pivot holes 3211 on the top and bottom pivot holder panels 321 of the quick release holder bracket 32 of the first quick release 3 by a second pivot member 55.

Figure 11:
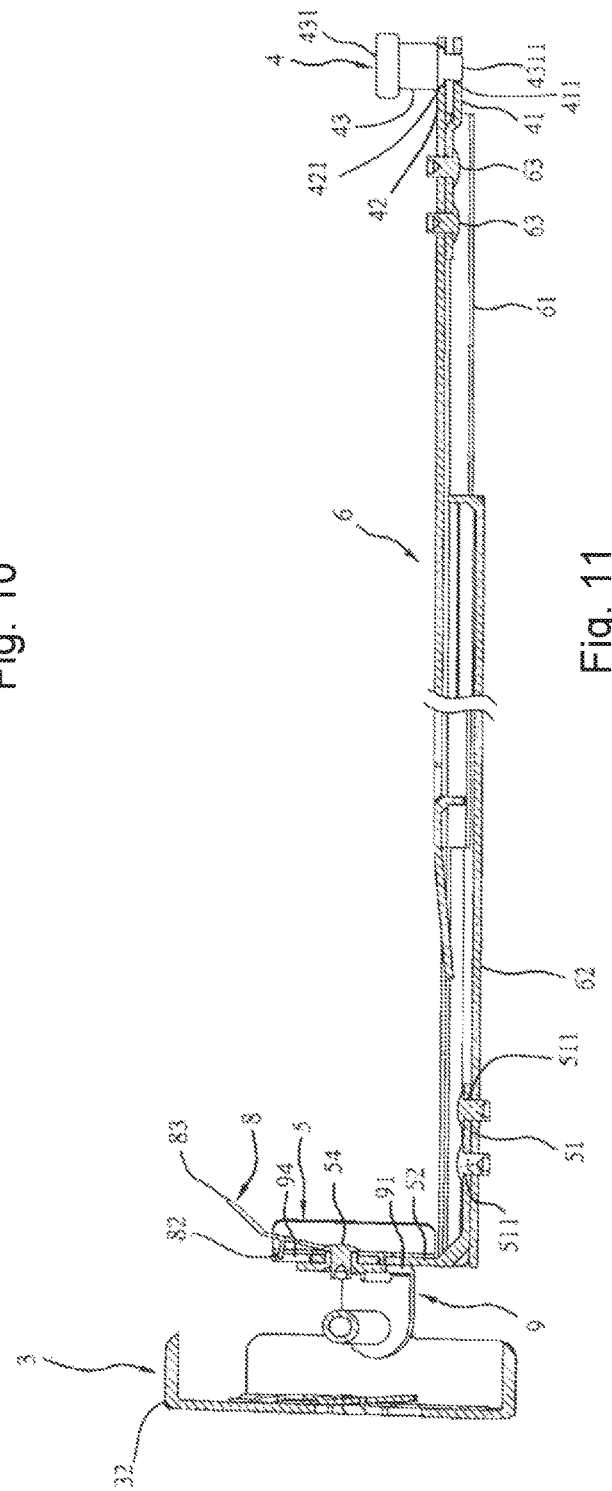
FIG. 11 is a schematic cross-sectional view of the present invention, illustrating the engagement portion of the retaining element moved away from the first retaining slot of the adjustment member and the adjustment member biased through an angle.
Figure 12:
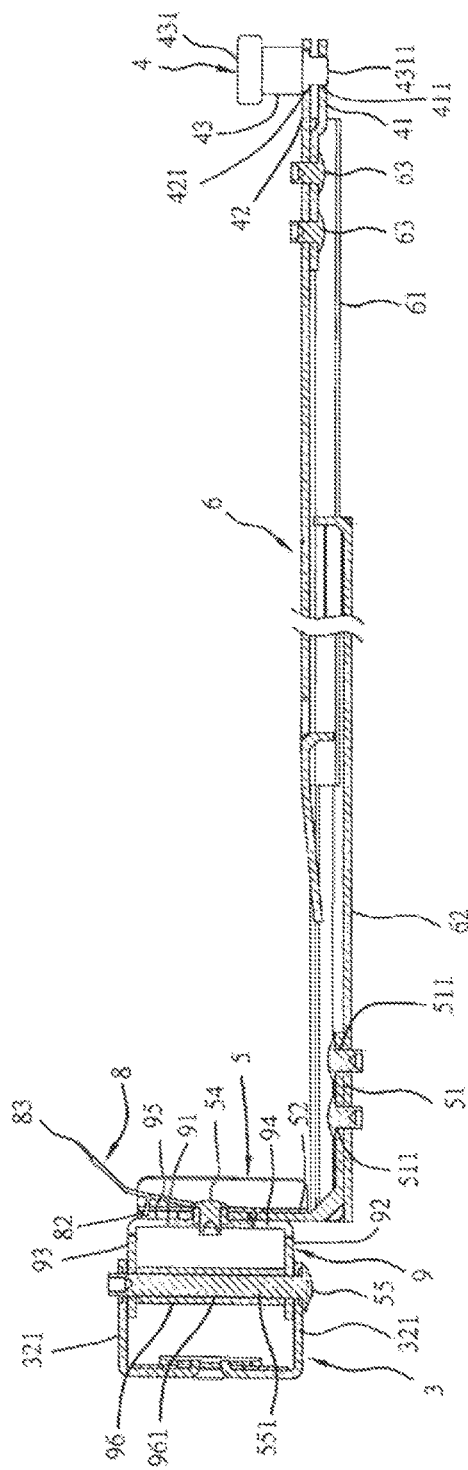
FIG. 12 is a schematic cross-sectional view of the present invention, illustrating the engagement portion of the retaining element moved away from the first retaining slot of the adjustment member and the adjustment member rotated through an angle if 180°.
Figure 13:
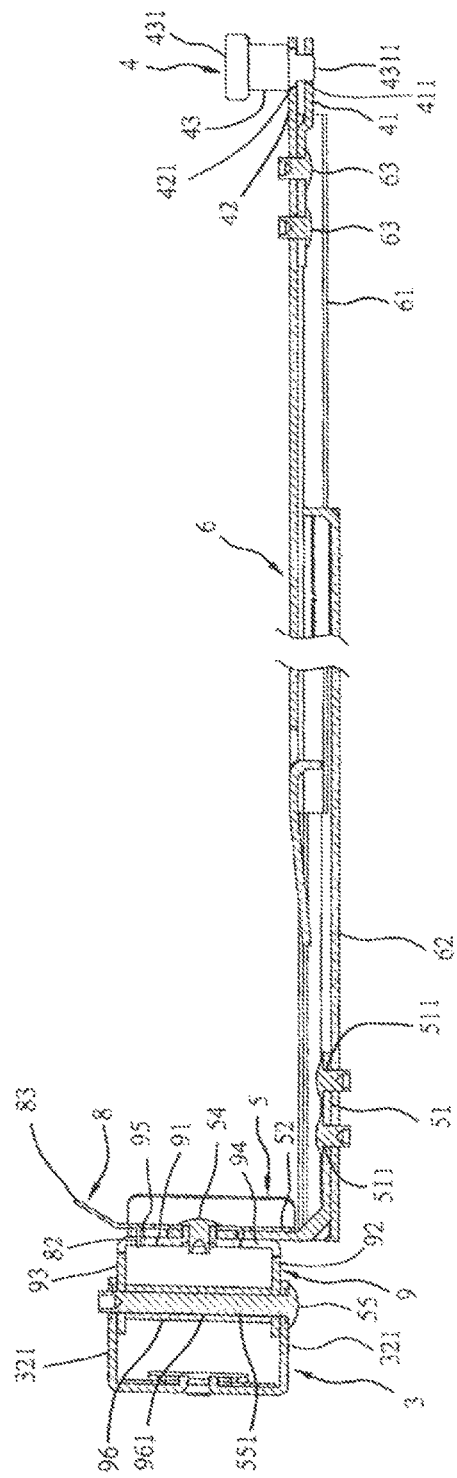
FIG. 13 is a schematic cross-sectional view of the present invention, illustrating the engagement portion of the retaining element moved away from the first retaining slot of the adjustment member and the adjustment member rotated through an angle of 180° and engaged into the other retaining slot.
Figure 14:
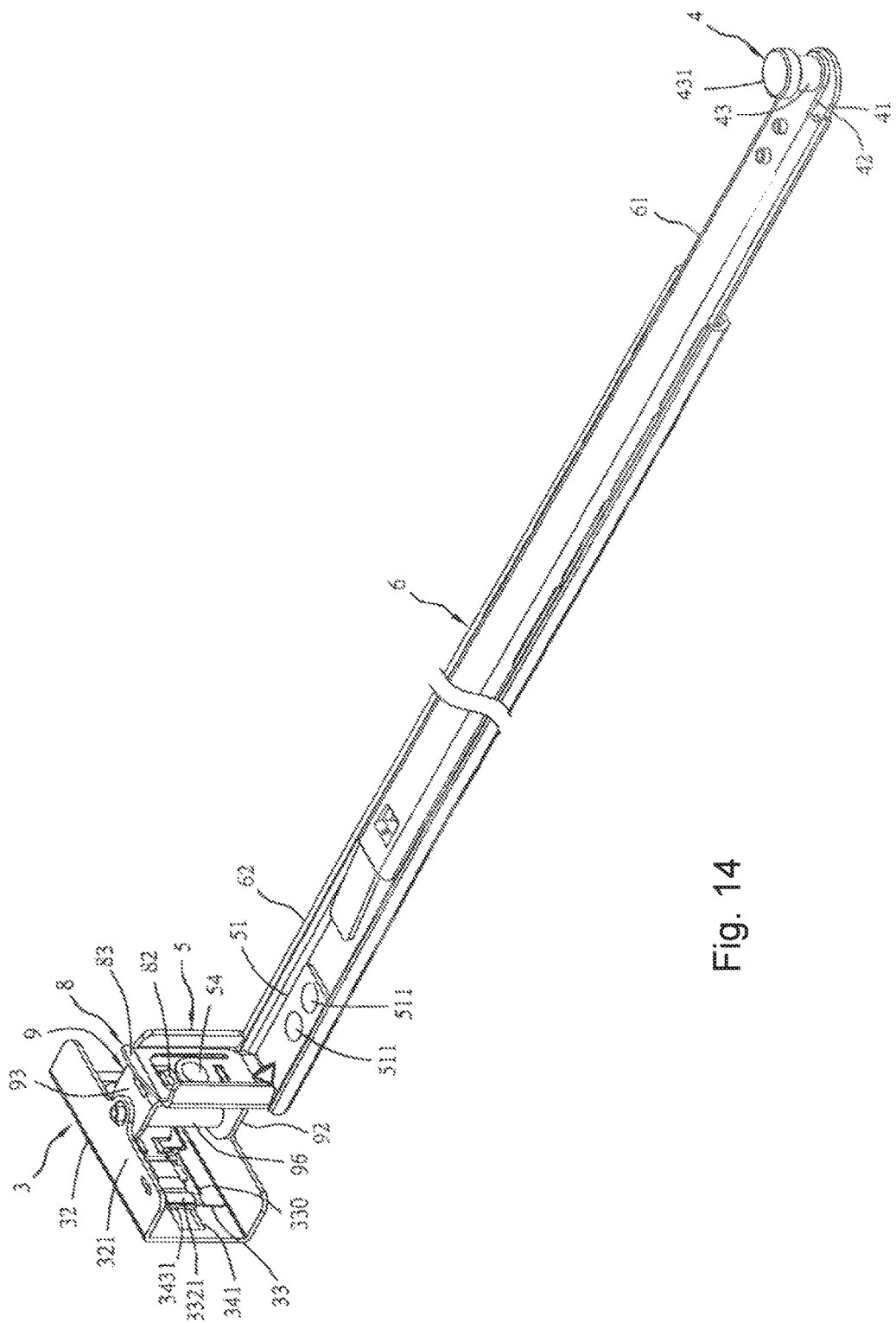
FIG. 14 is a perspective view of the assembly shown in FIG. 13.
Figure 15:
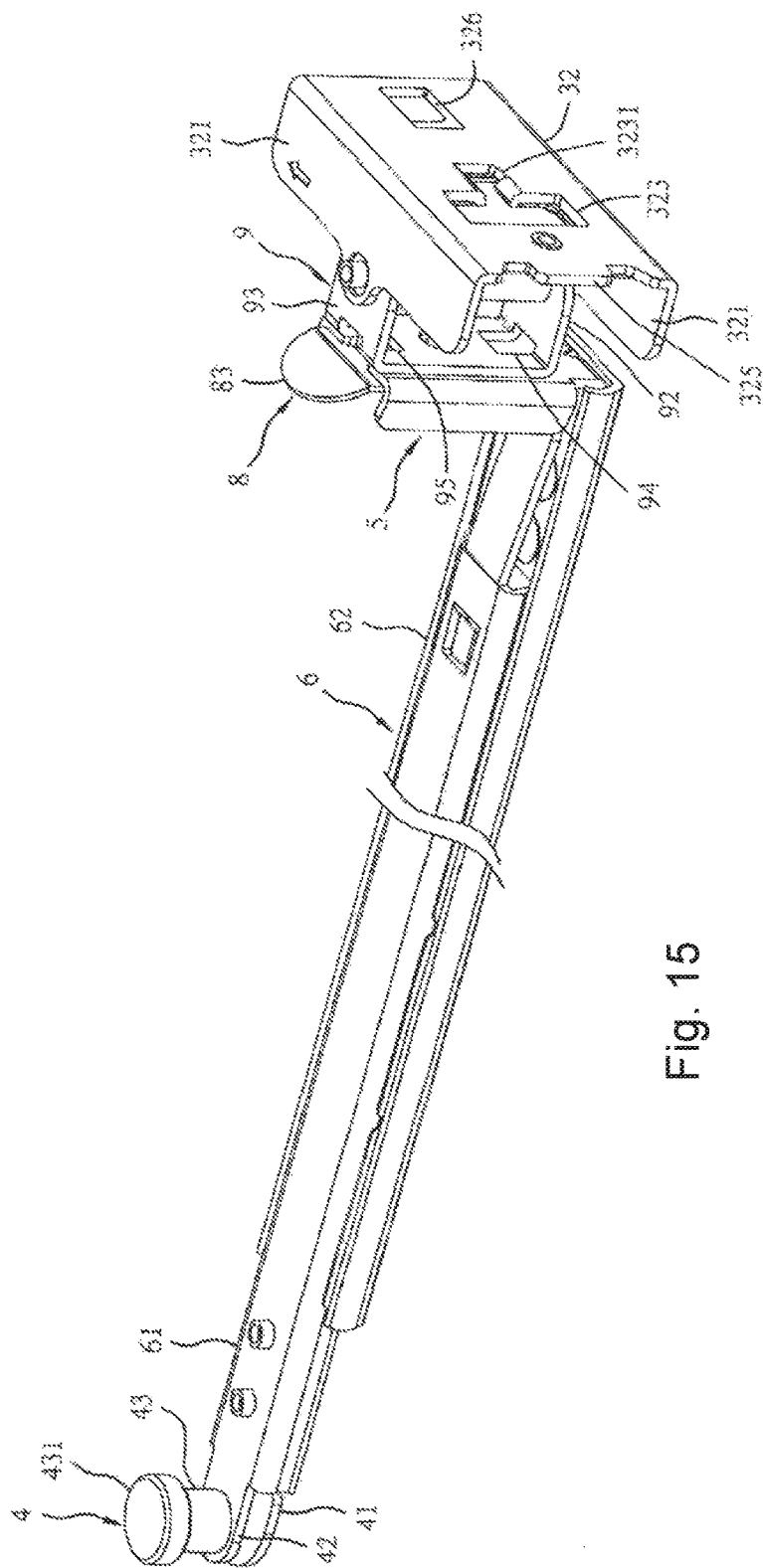
FIG. 15 is a perspective view that corresponds to FIG. 14 when viewed from another angle.
Figure 16:
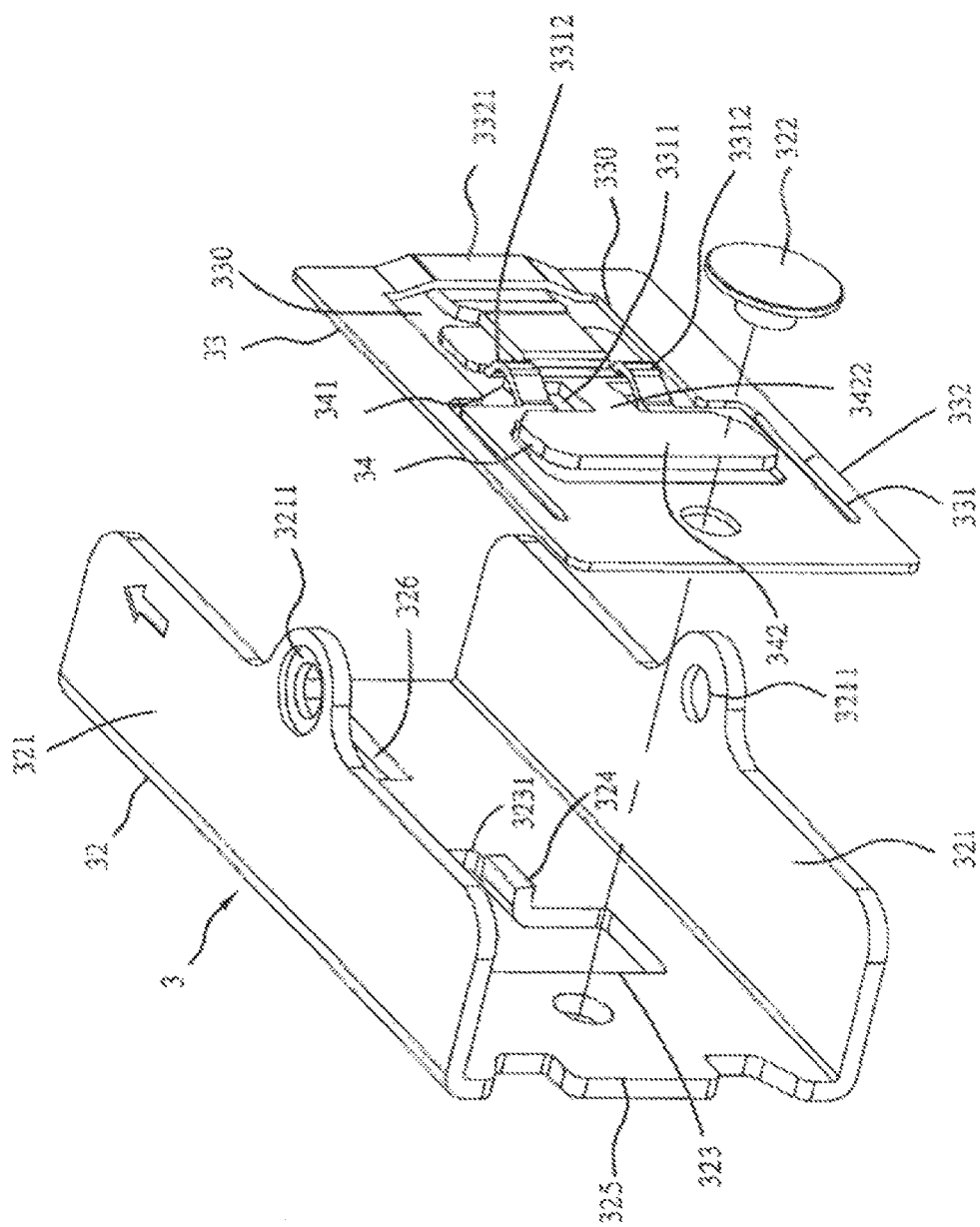
FIG. 16 is an exploded perspective view, in an enlarged scale, of the first quick release.

Thus, when the engagement portion 82 of the retaining element 8 is engaged into the top retaining slot 94 of the adjustment member 9, the opposite end of the support bar set 6 can be connected to the horizontal insertion groove 12 by the first quick release 3 and the engagement plate 11 at the outer sliding rail 102 of the left server sliding rail assembly 10 (see FIGS. 5-8). The support bar set 6 has its one end connected to the connecting frame 7 at the intermediate sliding rail 101 of the right server sliding rail assembly 10 by the second quick release 4. Thus, as illustrated in FIGS. 6-9, the support bar set 6 may support a cable management rack 2 at the right server sliding rail assembly 10. The cable management rack 2 illustrated in FIG. 9 has two connection portions 21, 22 connected to the right server sliding rail assembly 10. The connection arrangement between the cable management rack 2 and the right server sliding rail assembly 10 is not within the scope of the present invention, and therefore we do not repeat it. Further, if the cable management rack 2 is mounted at the left server sliding rail assembly 10, it is not necessary to change the mounting arrangement between the support bar set 6 and the first and second quick releases 3, 4. In this case, the user simply needs to turn the first quick release 3 relative to the support bar set 6 through 180°. At this time, the user biases the finger strip 83 of the retaining element 8 to disengage the engagement portion 82 from the top retaining slot 94 of the adjustment member 9 (see FIG. 10), and then, the quick release holder bracket 32 of the first quick release 3 and the adjustment member 9 may be rotated, as illustrated in FIG. 11. After the user biases or rotates the quick release holder bracket 32 of the first quick release 3 and the adjustment member 9 through 180° (see FIG. 12), the user releases the pressure from the finger strip 83 of the retaining element 8, enabling the engagement portion 82 of the retaining element 8 to be forced by the elastic restoring energy of the retaining element 8 into engagement with the retaining slot 95 of the adjustment member 9 (see FIG. 13). At this time, the support bar set 6 can be connected with its one end to the engagement plate 11 and the horizontal insertion groove 12 at the outer sliding rail 102 of the right server sliding rail assembly 10 by the first quick release 3 (see FIGS. 13-15), and connected with its other end to the connecting frame 7 at the intermediate sliding rail 101 of the right server sliding rail assembly 10 by the second quick release 4. Thus, the support bar set 6 can fit a cable management rack 2 that is mounted at either the right server sliding rail assembly 10 or left server sliding rail assembly 10. In other words, simply by biasing or rotating the quick release holder bracket 32 of the first quick release 3 and the adjustment member 9 through 180°, the support bar set 6 can support a cable management rack 2 that is mounted at the left or right server sliding rail assembly 10.

Further, as illustrated in FIG. 1, a sleeve 96 is mounted in between the opposing top and bottom panels 92, 93 of the adjustment member 9. The sleeve 96 defines therein an axle hole 961 for the passing of the shank 551 of the second pivot member 55 to enhance the stability and rotating smoothness of the adjustment member 9 upon biasing or rotation of the first quick release 3.

In conclusion, the invention provides a server sliding rail quick release mounting structure, which as advantages and features as follows.

For supporting a cable management rack 2 that is mounted at the left or right server sliding rail assembly 10, it is not necessary to replace the support bar set 6 and the first and second quick releases 3, 4, as the user simply needs to bias the finger strip 83 of the retaining element 8 to disengage the engagement portion 82 from the top retaining slot 94 or bottom retaining slot 95 of the adjustment member 9, and then to bias or rotate the quick release holder bracket 32 of the first quick release 3 and the adjustment member 9 through 180° so as to fit the particular mounting direction of the cable management rack 2.

The first and second quick releases 3, 4 at the two opposite ends of the support bar set 6 can be conveniently and rapidly mounted to or dismounted from the connecting frame 7 at the intermediate sliding rail 101 of one server sliding rail assembly 10 and the outer sliding rail 102 of the other server sliding rail assembly 10 without tools.

The first quick release 3 simply consists of the quick release holder bracket 32, the control spring plate 33 and the actuation member 34, saving installation labor and time. Further, the engagement plate 11 and the horizontal insertion groove 12 can be integrally formed on the outer sliding rail 102 using a stamping technique, significantly reducing the cost and enhancing product competitiveness.

What is claimed is:

1. A server sliding rail quick release mounting structure, comprising two server sliding rail assemblies each consisting of an inner sliding rail, an intermediate sliding rail and an outer sliding rail, a connecting frame affixed to said intermediate sliding rail of each said server sliding rail assembly, at least one engagement plate and a horizontal insertion groove arranged on said outer sliding rail of each said server sliding rail assembly, a support bar set, a first quick release detachably connecting one end of said support bar set to said engagement plate and said horizontal insertion groove at said outer sliding rail of the other said server sliding rail assembly, and a second quick release detachably connecting an opposite end of said support bar set to said connecting frame at said intermediate sliding rail of one said server sliding rail assembly, said connecting frame comprising a connecting plate having one end thereof fixedly fastened to one end of the associating said intermediate sliding rail, a lug extended from said connecting plate and having a pivot hole wherein the server sliding rail quick release mounting structure further comprises:
    a connection plate comprising a first connection plate wall and a second connection plate wall connected at a right angle, said first connection plate wall fixedly connected to one end of said support bar set, said second connection plate wall having a top end thereof pivotally connected to a retaining element and an adjustment member;
    said retaining element having a through hole pivotally connected to said second connection plate wall of said connection plate, a protruded engagement portion spaced above the through hole of said retaining element and adapted for engaging said adjustment member, and a finger gripping strip located at a top side thereof; and
    said adjustment member comprising a base panel, opposing top and bottom panels respectively and perpendicularly extended from opposing top and bottom sides of said base panel, a middle part of said base panel pivotally connected to said connection plate and said retaining element, a top retaining slot located at a junction between said base panel and said top panel and a bottom retaining slot located on the junction between said base panel and said bottom panel, said top retaining slot and said bottom retaining slot being so arranged that when said adjustment member is rotated through 180°, said engagement portion of said retaining element is selectively engaged into said top retaining slot or said bottom retaining slot, said top panel and said bottom panel of said adjustment member further being pivotally connected to said first quick release.

2. The server sliding rail quick release mounting structure as claimed in claim 1, further comprising a sleeve mounted in between the said top panel and said bottom panel of said adjustment member.

3. The server sliding rail quick release mounting structure as claimed in claim 1, further comprising:
    wherein said one end of said connecting plate is connected to said intermediate sliding rail by a first fastening member;
    wherein said first connection plate wall has at least one through hole by which said first connection plate is connected to one end of said second bar member by at least one third fastening member;
    wherein said second connection plate wall has a top end thereof pivotally connected to said retaining element and said adjustment member by a pivot member;
    wherein the retaining element further comprises a through hole located on a middle part thereof by which said retaining element is pivotally connected to said second connection plate wall of said connection plate;
    wherein said base panel of said adjustment member further comprises a pivot hole located on said middle part thereof;
    wherein a pivot hole is located on each of the respective top panel and bottom panel of said adjustment member and pivotally connected to said first quick release by a second pivot member.

4. The server sliding rail quick release mounting structure as claimed in claim 3, further comprising a sleeve mounted in between the said top panel and said bottom panel of said adjustment member, said sleeve defining therein an axle hole for the passing of said second pivot member.

5. The server sliding rail quick release mounting structure as claimed in claim 1, wherein said first quick release further comprises:
    a quick release holder bracket;
    a control spring plate fixedly connected to a middle part of one end of said quick release holder bracket, and having two curved protruding portions being pivotally connected to said quick release holder bracket by an actuation member; and
    the actuation member having an actuation portion that releasably connects to said engagement plate at said outer sliding rail of one of said server sliding rail assemblies.

6. The server sliding rail quick release mounting structure as claimed in claim 5, wherein said first quick release further comprises:
    said quick release holder bracket comprising opposing top and bottom pivot holder panels, a pivot hole located on each said top and bottom pivot holder panel, a slot cut through opposing front and back sides thereof and defining a narrow slot portion, two stop flanges respectively located at two opposite sides of said narrow slot portion, a plug piece protruded from one end thereof, and a retaining hole disposed near an opposite end thereof;
    said control spring plate being fixedly connected to said middle part of one end of said quick release holder bracket by a fastener, and said control spring plate further comprising an inverted U-shaped slot, an inner spring plate part surrounded by said inverted U-shaped slot and an outer spring plate part surrounding said inverted U-shaped slot, said inner spring plate part being fixedly connected with one end thereof to said quick release holder bracket by said fastener, said inner spring plate part comprising an inner hole that faces toward the slot of said quick release holder bracket and two curved protruding portions at two opposite sides of said inner hole, said two curved protruding portions being pivotally connected to said quick release holder bracket by said actuation member, said outer spring plate part comprising a baffle portion located at a free end thereof and adapted for stopping against a part of the said retaining hole of said quick release holder bracket, said baffle portion being by said actuation member to move away from the said retaining hole of said quick release holder bracket; and said actuation member comprising two pivot rods pivotally coupled between said two curved protruding portions of said control spring plate and said quick release holder bracket, a grip located at one end thereof and facing toward said inner hole of said control spring plate and said slot of said quick release holder bracket and said actuation portion located at an opposite end thereof, said actuation portion having an end edge adapted for stopping against said engagement plate at said outer sliding rail of one said server sliding rail assembly, said actuation portion being inserted in between said baffle portion of the said outer spring plate part of said control spring plate and said slot of said quick release holder bracket so that when said grip of said actuation member is pressed by an external force, said actuation portion of said actuation member is forced to move the said baffle portion of said outer spring plate part of said control spring plate.

7. The server sliding rail quick release mounting structure as claimed in claim 6, wherein said grip of said actuation member defines a neck portion disposed between said two stop flanges of said quick release holder bracket.

8. The server sliding rail quick release mounting structure as claimed in claim 1, wherein said support bar set further comprises a first bar member and a second bar member coupled to and movable along said first bar member, and wherein said second quick release further comprises:

a positioning plate extended from one end of said first bar member, said positioning plate further comprising a positioning hole;

a locating plate extended from said one end of said first bar member and spaced from said positioning plate by a gap, said locating plate further comprising a through hole for the mounting of a spring bolt; and a spring bolt releasably connecting said positioning plate, said locating plate and said lug of said connecting frame at one said intermediate sliding rail, comprising a head and a reduced diameter tip, said reduced diameter tip being inserted through the said through hole of said locating plate into the said positioning hole of said positioning plate in such a manner that when pulling said head of said spring bolt upward, said reduced diameter tip is moved out of the said positioning hole of said positioning plate into the said through hole of said locating plate for allowing the said lug of the said connecting frame at one said intermediate sliding rail to be inserted into the said gap between said positioning plate and said locating plate; when releases the pulling force from said head of said spring bolt, the elastic restoring energy of said spring bolt immediately forces said reduced diameter tip into the said pivot hole of said lug and the said positioning hole of said positioning plate.

* * * * *